US009559232B1

(12) United States Patent
Naud et al.

(10) Patent No.: US 9,559,232 B1
(45) Date of Patent: Jan. 31, 2017

(54) FOLDING DEPLOYMENT SYSTEM FOR SOLAR PANELS

(71) Applicants: Steven F. Naud, Lynn Haven, FL (US); Robert C. Woodall, Jr., Panama City, FL (US); David H. Wilbanks, Panama City Beach, FL (US); Amy N. Satterlee, Lynn Haven, FL (US)

(72) Inventors: Steven F. Naud, Lynn Haven, FL (US); Robert C. Woodall, Jr., Panama City, FL (US); David H. Wilbanks, Panama City Beach, FL (US); Amy N. Satterlee, Lynn Haven, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 644 days.

(21) Appl. No.: 13/932,635

(22) Filed: Jul. 1, 2013

(51) Int. Cl.
   *H01L 31/04* (2014.01)
   *H01L 31/054* (2014.01)
   *H02S 30/20* (2014.01)
   *H02S 20/30* (2014.01)
   *H01L 31/042* (2014.01)

(52) U.S. Cl.
   CPC ............ *H01L 31/045* (2013.01); *H02S 30/20* (2014.12); *H01L 31/042* (2013.01); *H01L 31/0547* (2014.12); *H02S 20/30* (2014.12); *H02S 20/32* (2014.12)

(58) Field of Classification Search
   CPC .......... Y02E 10/47; Y02E 10/50; H02S 20/00; H02S 20/20; H02S 30/20; H02S 20/30; H02S 20/32; H01L 31/0547; H01L 31/18; H01L 31/042
   USPC .................................................. 136/243–265
   See application file for complete search history.

(56) References Cited

U.S. PATENT DOCUMENTS

| 2005/0103329 | A1* | 5/2005 | Essig, Jr. | ................ | E04H 15/20 126/697 |
| 2011/0253614 | A1* | 10/2011 | Curran | .................... | H02S 20/23 210/239 |
| 2012/0313569 | A1* | 12/2012 | Curran | .................... | F24J 2/523 320/101 |

* cited by examiner

*Primary Examiner* — Jayne Mershon
*Assistant Examiner* — Mayla Gonzalez Ramos
(74) *Attorney, Agent, or Firm* — James T. Shepherd

(57) ABSTRACT

A folding deployment system for solar panels provides a portable solar collecting power station that can be easily packaged and deployed for use in diverse environments. A solar array frame extends and contracts in accordion fashion. Solar panels mounted on the solar array frame are pivotally moveable from an upright position in a stowed position inside a container to a substantially horizontal position outside the container in a deployed position.

11 Claims, 4 Drawing Sheets

FOLDING DEPLOYMENT SYSTEM FOR SOLAR PANELS

STATEMENT OF GOVERNMENT INTEREST

The invention described herein may be manufactured and used by or for the Government of the United States of America for governmental purposes without the payment of any royalties.

BACKGROUND OF THE INVENTION (1) Field of the Invention

The present invention relates generally to portable solar energy systems and more specifically to a folding structural deployment system for solar panels.

(2) Description of the Prior Art

Solar power systems can be less costly than other types of power sources in more remote areas where power from centralized generators is unavailable. This is particularly true when the cost to continuously transport and store fuel is factored into the situation, especially in areas where the climate and topography are conducive to harvesting solar energy.

In rugged remote areas, islands, regions without roads, deserts, and the like, solar power can be a more desirable source of energy both in terms of reliability and cost. Similarly, solar power could also be useful in humanitarian relief efforts and organizations. If reliably available, solar power offers opportunities for people in regions which have been affected by partial or total loss of power systems, or areas which lack of infrastructure to support power systems. Additional uses for solar power include communication capabilities, medical equipment power source, and other similar necessities and necessary services.

Many systems that deploy solar arrays for electric power have been fielded. Unfortunately, these systems suffer from similar deficiencies, including, but not limited to, less than adequate functionality, decreased efficiency and optimization, and weight and portability issues. Many are cumbersome to set up and are not suitable for deployment at the best angle relative to the solar orientation of the sun to obtain maximum power yield. These problems may be more pronounced if the power system is to be frequently moved and/or require repeated operation of mechanical parts susceptible to damage.

The prior art does not show the features of the present invention, which provides for an easily transported, rugged, folding solar array which overcomes the above mentioned limitations. Accordingly, those of skill in the art will appreciate the present invention which addresses the above discussed problems.

SUMMARY OF THE INVENTION

Accordingly, it is an object of the present invention to provide an improved structural deployment system for solar panels.

Another object of the present invention is to provide a containerized solar collecting station that can be easily packaged and deployed for use in diverse environments.

Another object of the invention is a portable solar power collecting system which makes maximum use of deployment angle relative to the sun's solar orientation to garner maximum power yield.

A further object of the invention is to provide rugged external protection from the environment when the solar power system is in storage, shipping, and use configurations.

In accordance with the present disclosure, the present invention provides for a folding structural deployment system for solar panels, which may include, but is not limited to a container, a solar array frame comprising a plurality of pivotally connected struts, wherein the solar array frame is movable between a stowed position with the plurality of struts compressed against each other within the container and a deployed position with the plurality of struts being extended with respect to each other. In the deployed position, the solar array frame extends outside of the container. A plurality of solar panels are attached to the solar array frame such that the plurality of solar panels are held compactly in a substantially upright or transverse position with respect to the ground within the container when the solar array frame is in the stowed position. The plurality of solar panels is pivotally movable to a more horizontal position with respect to the ground when the solar array frame is in the deployed position.

In one embodiment, at least a majority of interconnections of the plurality of struts comprise a pivotal connection at each end the struts and a centrally located pivotal connection.

The deployment system may further comprise a support mechanism for the solar array frame. In one embodiment, the support mechanism comprises at least one extensible tube, which is supported by the container.

In another embodiment, the deployment system further comprises a plurality of slidingly connected tubes. In one embodiment, the deployment system further comprises a connector for connecting the extensible tube to the solar array frame while the extensible tube is bendable to provide a lifting force to the solar array frame.

The container may comprise an elongate opening that is substantially horizontal within which the extensible tube is supported at least in the stowed position. The system may further comprise a support cable that extends through the extensible tube and connects with the solar array frame.

In another embodiment, a solar array frame support base may be mounted to the container that carries the solar array frame. The solar array frame support base may comprise a floor of the container.

The deployment system may further comprise a sliding connector for the solar array frame support base configured to permit sliding movement of the solar array frame with respect to the container.

In yet another embodiment, the deployment system may further comprise a support beam on which the sliding connector is moveable. The sliding connector may be configured to slidingly move a solar panel positioned in a central portion of the container in the stowed position to a position outside the container in the deployed position for exposure to the sun.

The plurality of solar panels may be extendable out of at least one end of the container. In another embodiment, the plurality of solar panels may be extendable out of opposite ends of the container.

In another embodiment, the solar array frame further comprises at least one end support adjacent an end of the solar array frame to support the solar array frame with respect to a surface around the container.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention.

DETAILED DESCRIPTION OF THE INVENTION

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
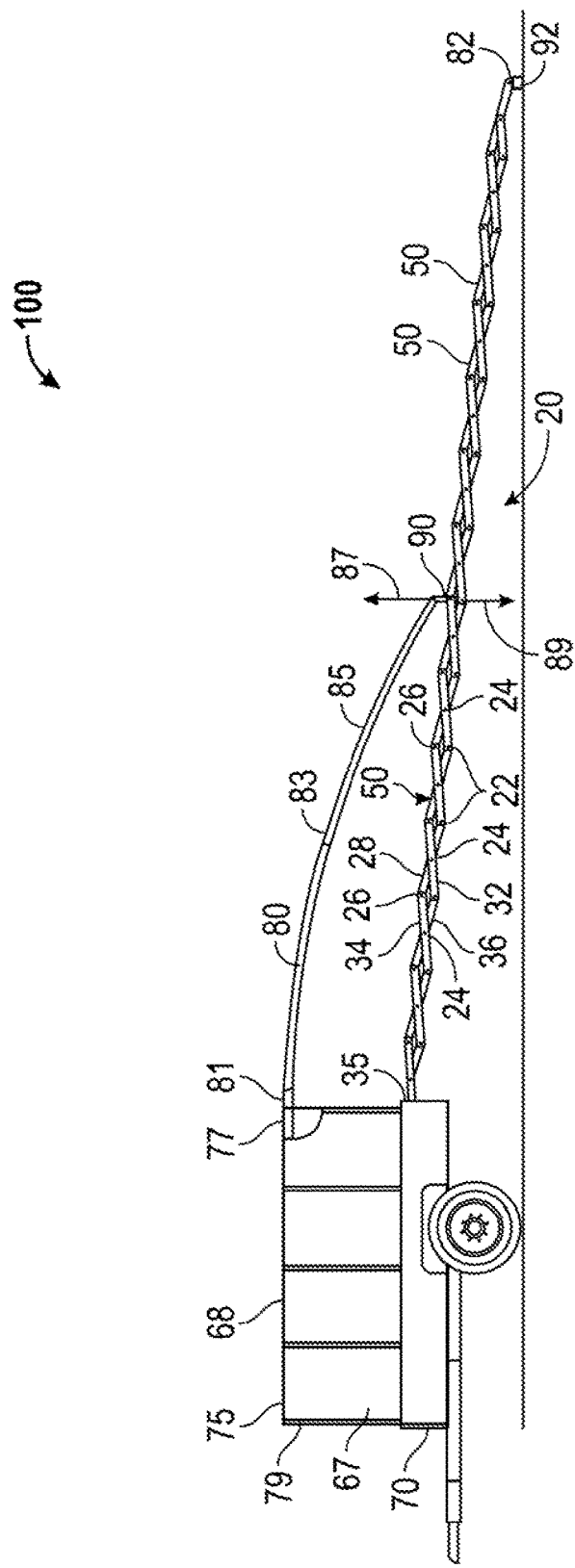
FIG. 1 is an elevational side view, showing a fully deployed folding structural deployment system for solar panels in accord with one possible embodiment of the invention.

Turning now to the drawings, and more particularly FIG. 1, there is shown a side view of one possible embodiment of containerized portable solar power system 100 built into a' container 75, which is typically constructed of steel and modified such that solar panels 50 (See also FIG. 3 and FIG. 4) may be housed and deployed in an efficient manner. The container panels such as sides 67, top 68, and end doors 79, protect solar panels 50 from external damage during transportation and storage of system 100.

In one embodiment, hollow elongate openings or tubes 77 define the top edges of container 75 that are oriented from front to back. The tubes can be substantially horizontal or roughly parallel to the Earth as illustrated. For reasons discussed hereinafter, hollow frame tubes 77 can be utilized to house extensible and/or telescopic beams 80 and 85 when not in use. Container 75 may be hauled by trailer 70, as presently depicted, or may stand alone, or may be transported by alternate means depending on the application. The internal arrangement of container 75 will be discussed in detail hereinafter in regards to FIG. 3.

In the present embodiment, solar array panels 50 are attached to solar array frame 20. Solar array frame 20 is extendable from container 75 until it reaches its fully deployed position as depicted in FIG. 1. Solar array frame 20 incorporates an accordion style folding mechanism with end pivot points 22, 26 and central pivot points 24. The pivot points allow struts, such as struts 28, 32, 34, and 36 to pivot with respect to each other between a stowed position and a deployed position. In this embodiment, pairs of struts, as strut pairs 28, 32 and 34, 36 are pivotally connected together at a center position with central pivots 24. The pairs of struts are also connected at opposite ends with end pivots 22 and 26. This accordion style pivotal connection arrangement enables the struts to be extended to a deployed state or contracted to a stowed state. In this embodiment, the endmost struts are not connected on both ends to other struts as are the remaining struts, which make up the majority of struts within solar array frame 20.

Figure 2:
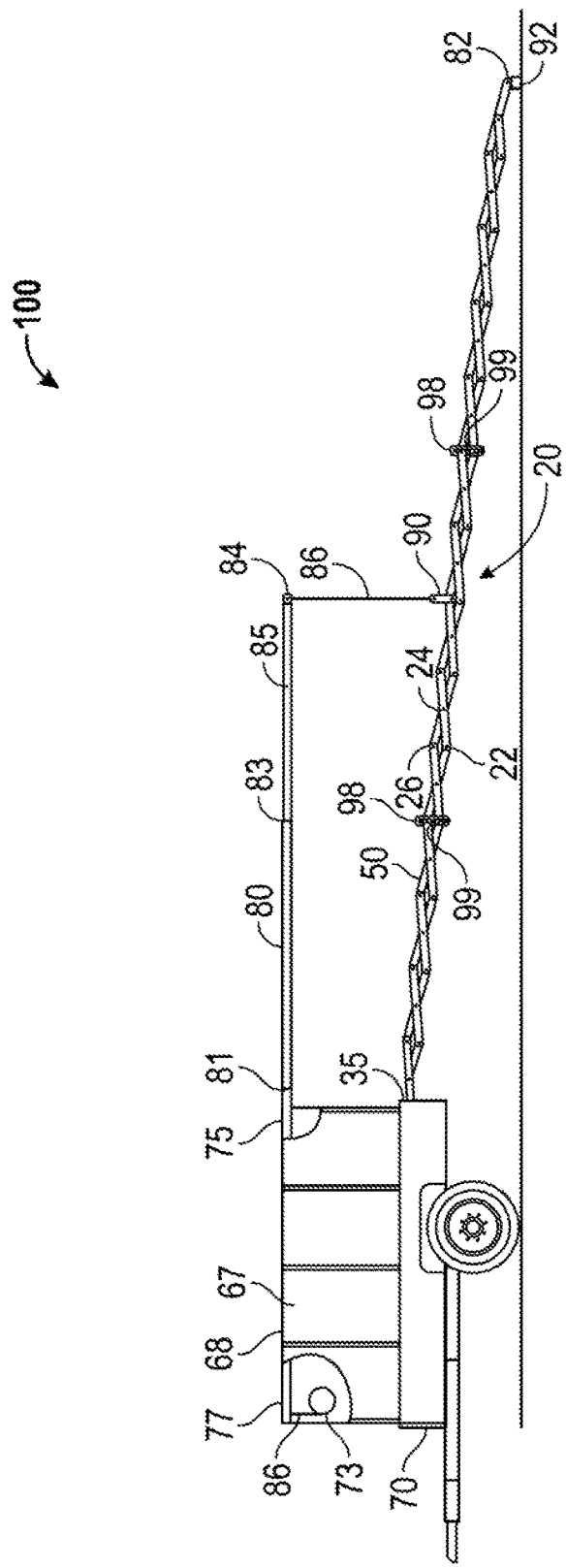
FIG. 2 is an elevational side view, partially cutaway, showing a fully deployed folding structural deployment system for solar panels in accord with another possible embodiment of the invention.
Figure 3:
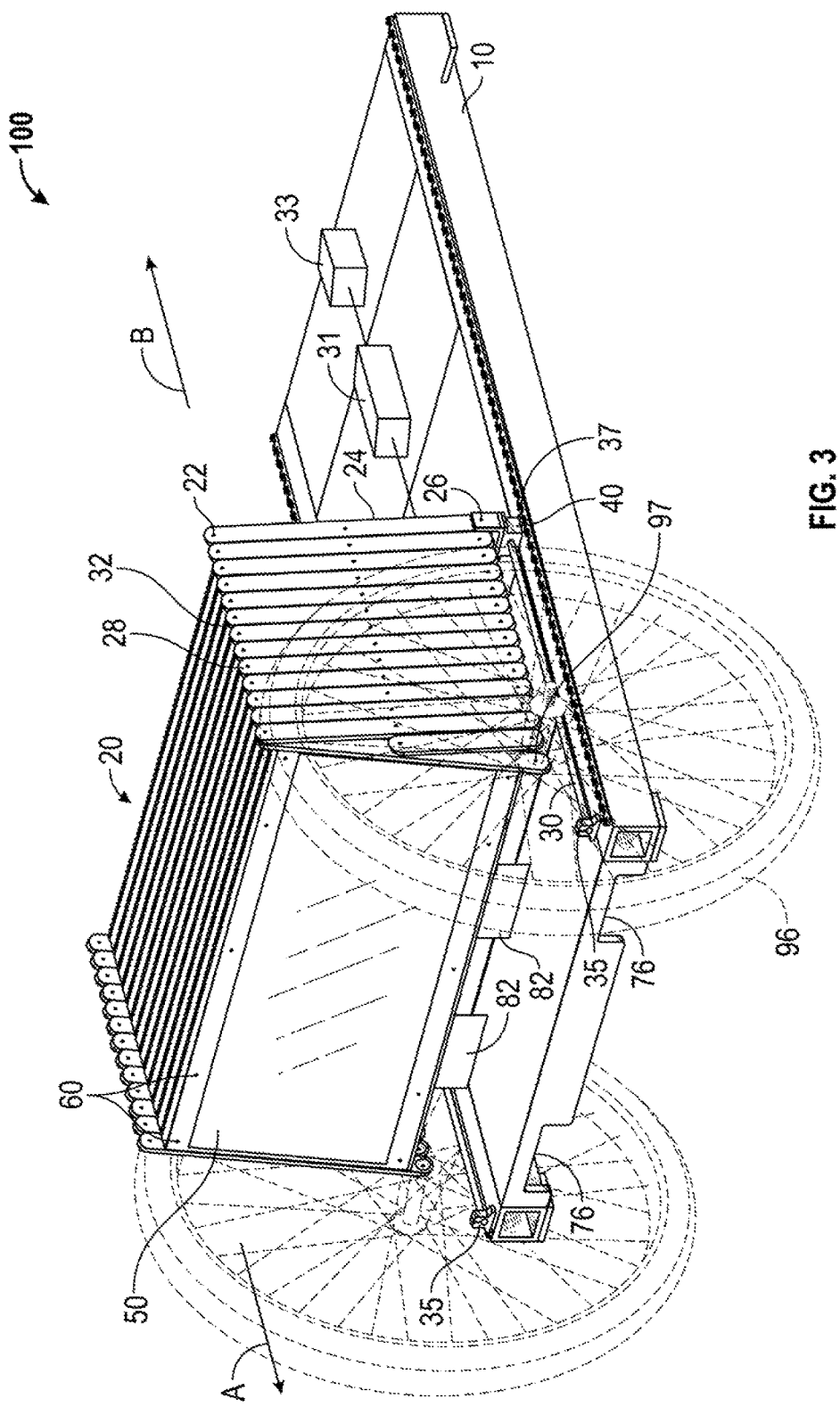
FIG. 3 is a perspective view, showing a folding structural deployment system for solar panels in a stowed position in accord with one possible embodiment of the invention.
Figure 4:
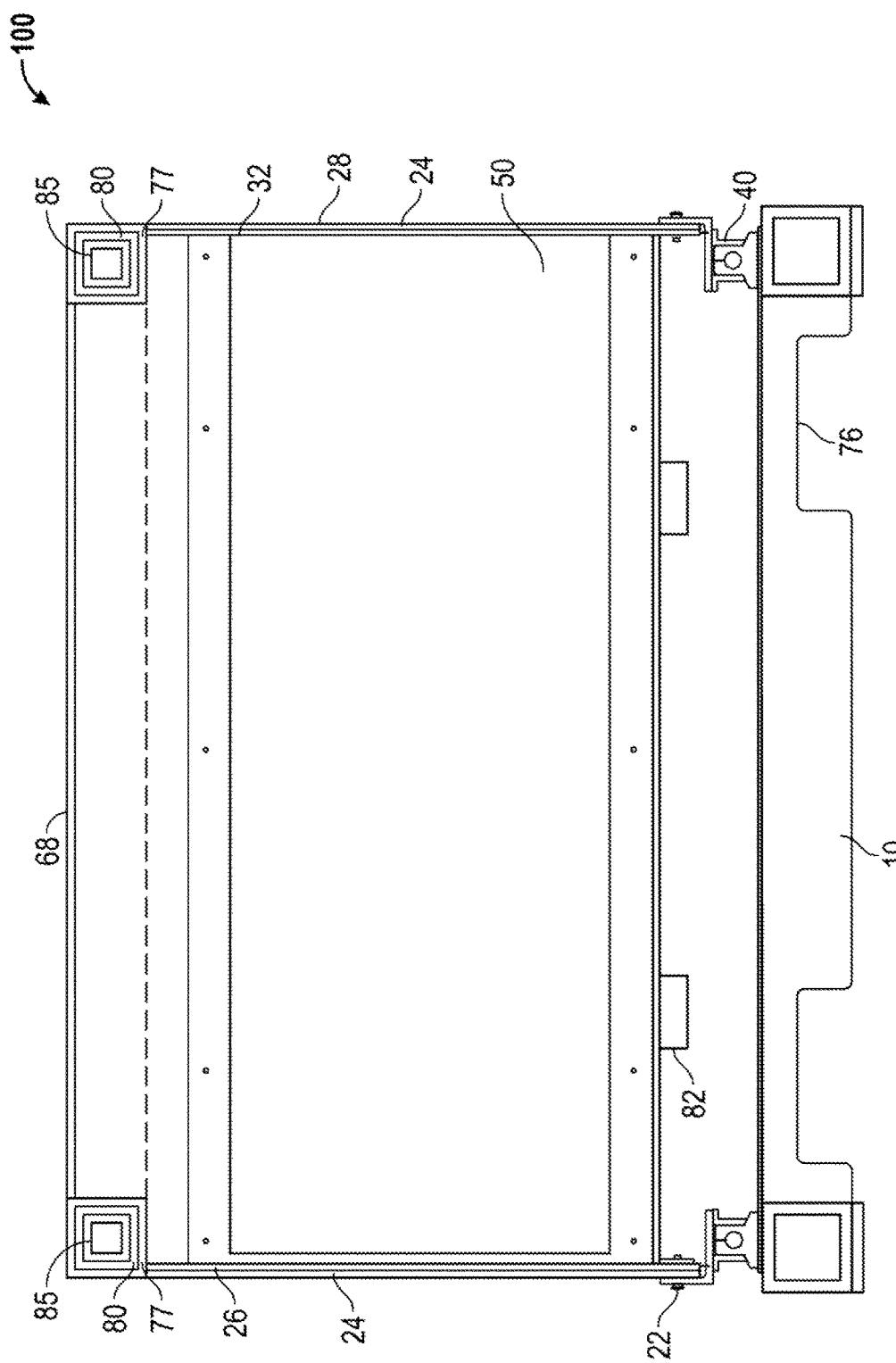
FIG. 4 is an elevational end view, showing a folding structural deployment system for solar panels in a stowed position in accord with one possible embodiment of the invention.

During operation, the struts begin in a relatively vertical or upright position with the struts being compressed together and being substantially parallel to each other, as shown in FIG. 3. As the struts are moved to an extended position, the struts pivot around central pivot points 24 to a relatively horizontal position with each pair of struts being substantially extended end to end as shown in FIG. 1 and FIG. 2. Solar panels 50 are mounted to the inner positioned struts as indicated in FIG. 4 where strut 32 is an inwardly positioned strut and strut 28 is an outwardly positioned strut. As discussed above, struts 28 and 32 are pivotally connected at center pivot 24.

If the struts are fully extended so that the struts are parallel to each other, then solar array frame 20 may be weakened and collapse. However, if desired, supports may be utilized to support solar array frame 20 to prevent collapse even when extended by this amount. In this way, solar panels may be oriented essentially parallel to each other.

However, if desired, stop devices 98 shown in FIG. 2 may be utilized to prevent the struts from becoming parallel with respect to each other, whereupon solar array frame 20 may lose strength and bend. In this embodiment, stop devices 98 are mounted over end pivots, such as pivots 22, 26 with two slots 99, that fit over the pivots 22, 26 whereby movement of these two pivots is stopped or limited, especially when array frame 20 is expanded. In other words, the slots provide stops the prevent pivots 22, 26 from moving too close together. On the other hand, the slots are preferably long enough to allow the struts to fold completely. The stop devices 98 may be longer than shown and in one embodiment are about as long as the struts. In another embodiment, stop devices 98 may also act as folding supports or comprise extendable members (not shown) that engage the ground. As noted above, the drawings are not intended to be to scale. Two stop devices 98 may be placed at positions about one third and two thirds along the length of array frame 20.

Once solar array frame 20 is fully extended by the desired amount, solar panels 50 may align or substantially align into one solid rigid array. Handles 82 may be used on the endmost pair of struts or in other positions on solar array frame 20 to assist in moving solar array frame 20 between the stowed and deployed positions. It will be noted that when the array is not fully extended, the solar panels may be oriented at an angle to better capture sun radiation that comes from a relatively closer position to the horizon. Extension or retraction of the solar panel therefore may be utilized to perform a certain amount of tracking of the sun, if desired.

In one possible embodiment, wheels 96 may be mounted to an end of solar array frame 20 to assist in opening and supporting the frame. The wheels may be pivotally mounted at 97 and may, if desired, comprise connections that snap in place when it is desired to pull the frame out. In one possible embodiment, the wheels are sufficiently large to roll over uneven terrain and may be about the size of a typical bicycle wheel about three feet in diameter plus or minus about a foot.

Solar array frame 20 can be supported on the ground or surface around the container by one or more end supports or feet 92 on an end closest to handles 82. Feet 92 can be designed in a telescoping manner to manually adjust the angle of solar panels 50 to maximize the seasonal orientation of the sun. In another embodiment, an active extension retraction system (not shown) attached to feet 92, either hydraulic or pneumatic, may be paired with solar detecting sensors to track the sun and automatically adjust the height of feet 92. Additional feet or supports to engage the ground may be utilized on other locations on solar array frame 20 and may be separately attached, mounted on wheels, be adjustable, or the like.

Once solar array frame 20 is extended with one or more feet 92 positioned properly relative to the sun, then system 100 will garner maximum solar incidence from the sun. Solar array frame 20 allows for proper support of solar panels 50 during operation, providing rigidity in the setup and reducing performance degrading curvature in solar panel array 50.

While feet may be utilized to support solar array frame 20 from beneath the array, if desired, a variety of telescoping support boom configurations are also possible utilizing container 75 as a base for a support boom to provide supports from above the array. In one embodiment, hollow frame tubes 77 and extensible beams 80, 85 act as a deployment and retraction aid for folding structural deployment system for solar panels 50 by producing an upward force on the array. Preferably, beams 80, 85 are constructed of carbon fiber or materials having similar properties.

In this embodiment, extensible beams 80, 85 are extendable from hollow frame tubes 77 (See FIG. 4) and attach to solar array frame 20 by way of connectors such as connector 90. In one embodiment, two sets of beams 80, 85 are connected on opposite sides of solar array frame 20, such that beam 80 is tube from which smaller beam 85 telescopically extends. If desired, more beams can be utilized or only one beam might be utilized. Connector 90 can be implemented with a variety of fasteners in accord with the present invention. Connector 90 is selected to adequately hold in place solar array frame 20 in relation to extensible beams 80, 85. Extensible beams 80, 85 bend in a spring-like manner with additional stress being required to increase the bend in the beams. Extensible beams 80, 85 produce an upward force, as indicated by arrow 87, to counteract the weight of solar array frame 20, as indicated by arrow 89. Accordingly, extensible beams 80, 85 are used as a counter spring to balance the weight of solar array frame 20, allowing deployment of the system to be easily accomplished by 1 or 2 men.

Folding structural deployment system for solar panels 100 allows solar panels 50 mounted on solar array frame 20 to be quickly deployed and stowed without the need to remove, mount, and electrically interconnect the solar arrays on the ground. The electrical wires to interconnect solar panels 50 are preferably included as part of a wiring harness on solar array frame 20.

Turning to FIG. 2, another embodiment of folding structural deployment system for solar panels 100 is depicted in the fully deployed position. This embodiment comprises a different support mechanism which allows for the system to be operated by only one or two men. As discussed above, solar array frame 20 incorporates an accordion style folding structure along pivot points 22, 24, and 26, which allows solar frame 20 to be pulled by handles 82 (See FIG. 3 and FIG. 4) and extend from a back end of container 75 until reaching a fully deployed position. As discussed above, end supports or feet 92 may be telescoping and can be used to ensure that solar panel array 50 is oriented to maximize the solar power garnered by the system.

In this embodiment, torsion spring or hand crank spool 73 is placed in an upper forward inside corner of container 75 or positioned in another convenient position. Cable 86 runs through hollow frame tubes 77 and extends through extensible tubes 80, 85, and tube exit 84. Cable 86 may then travel transversely or substantially perpendicular to extensible tubes 80, 85 and connect to solar array frame 20 via connector 90. As discussed hereinabove in regards to FIG. 1, connector 90 could be a variety of removable fasteners, including a D-clip. As crank 73 retracts and deploys cable 86, extensible tubes 80, 85 will also extend and retract at first tube junction 81 at end of hollow frame tube 77 and at second tube junction 83 segmenting extensible tubes 80, 85.

Referring now to FIG. 3 and FIG. 4, folding structural deployment system for solar panels 100 is depicted in the stowed position. In this depiction, the sides and top of container 75 are removed for ease of viewing the respective solar array components. In this embodiment, each panel of solar panel array 50 is attached to frame 20 by screws 60. However, alternative embodiments may use angle iron brackets to attach panels of solar panel array 50 to solar array frame 20 or solar panel array 50 may be integrated directly into the design of frame 20.

Solar array frame 20 is supported by solar array frame support base 10. Support base 10 may comprise or be part of the container floor but could also be separate from the container and mountable within the container onto the container floor. Accordingly, the system may be built as a unit and then inserted into or removed from containers as needed.

In one embodiment, array frame support base 10 comprises slide bearing 40 which travels between stops 35 and 37 which define the length of array frame support beam 30. This allows the entire solar array frame 20 to be moved from a central position to the end of the container so that all solar panels, even those positioned in the center of the container in the stowed position can be positioned in the sun. Array frame support beam 30 may be attached to array base 10 by suitable fasteners and connectors in accord with the present invention.

In one embodiment, two sets of array frames 20 and associated solar panels 50 may be utilized. One set may be deployed out of one side of the container as indicated by arrow A in FIG. 3, and another set (not shown) of array frame 20 and associated solar panels 50 may be deployed out the opposite side of the container as indicated by arrow B.

In one embodiment, solar array frame 20 may comprise a spring assembly (not shown) to assist a user in operating folding structural deployment system for solar panels 100. This spring assembly may comprise either a torsion spring arrangement, or an extension spring arrangement in accord with the present invention. Pulling on handles 82 allows solar array frame 20 to slide on linear bearings 40 outwardly from container 75, until the bearings 40 ultimately stop at endpoint 35 and solar panel array is fully extended outside of container 75. As frame 20 unfolds in accordion-like fashion, it will end up with one substantially flat planar surface that can be efficiently oriented with respect to the sun by end supports or feet 92 as described hereinabove with reference to FIG. 1 and FIG. 2.

Considerable excess space can be designed into the interior of container 75. This space may be utilized for related equipment such as batteries, wiring, switches, replacement equipment, tools, back-up fuel generators, fuel, other equipment, and the like, which may be necessary for solar power collecting systems in diverse environments.

In the illustrated embodiment of FIG. 3, battery charger 31 is operably connected between solar panel array 50 and batteries 33 to ensure maximum battery life for the system. If the container 75 is constructed of a metallic material, the metal walls are preferably grounded to a common ground, if available. The system, when mounted on a truck or the like, may comprise a floating ground as commonly used in vehicles.

Although container 75 for trailer 70 is discussed predominantly herein, container 75 can be relatively small to reduce the cost for smaller requirements, made significantly larger, and/or be combined in numbers to create readily transportable significant power sources. Notches 76 in base 10 provide means for a forklift to load and unload container 75 from trailers and/or other similar commercial transportation vehicles.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A deployment system for solar panels, comprising:
   a container having two sides, two ends, and a top;
   a solar array frame comprising a plurality of pivotally connected struts, said solar array frame movable between a stowed position with said plurality of struts compressed against each other within said container and a deployed position with said plurality of struts being extended with respect to each other whereby said solar array frame extends outside of said container;
   a plurality of solar panels attached to said solar array frame such that said plurality of solar panels are held substantially upright with respect to the ground within said container when said solar array frame is in said stowed position, said plurality of solar panels being pivotally movable to a more horizontal position with respect to the ground when said solar array frame is in said deployed position;
   at least one elongate hollow frame tube mounted adjacent to said top and oriented substantially parallel to said sides;
   at least one extensible tube housed within said hollow frame tube when said solar array frame is in said stowed position, said extensible tube extending from said hollow frame tube when said solar array frame is in said deployed position; and
   a support cable that extends through said extensible tube and means for retracting and deploying said cable disposed within said container, whereby said cable has a first end connected to said solar array frame and a second end connected to said means for retracting and deploying.

2. The deployment system of claim 1, wherein at least a majority of said plurality of struts comprise a pivotal connection at each end and a centrally located pivotal connection.

3. The deployment system of claim 1, wherein said extensible tube comprises a plurality of telescoping beams.

4. The deployment system of claim 3, further comprising a connector for connecting said extensible tube to said solar array frame, whereby said extensible tube forms a counter spring to provide a lifting force to said solar array frame when said solar array frame is in said deployed position.

5. The deployment system of claim 1, further comprising a solar array frame support base mounted to said container, said solar array frame support base carrying said solar array frame.

6. The deployment system of claim 5, wherein said solar array frame support base comprises a floor of said container.

7. The deployment system of claim 6, further comprising at least two support beams mounted on said solar frame support base and having first ends adjacent to one of said ends of said container and second ends in the interior of said container, a slide bearing movably mounted on each of said support beams, a first stop mounted to each said support beam adjacent to said first end thereof, and a second stop mounted to each said support beam adjacent to said second end thereof; wherein said solar array frame is mounted to said slide bearings.

8. The deployment system of claim 1, wherein said plurality of solar panels are extendable out of at least one of said ends.

9. The deployment system of claim 1, wherein said plurality of solar panels are extendable out of both of said ends of said container.

10. The deployment system of claim 1, wherein said solar array frame further comprises at least one end support adjacent an end of said solar array frame to support said solar array frame with respect to a surface around said container.

11. The deployment system of claim 1 further comprising a plurality of wheels mountable to an end of said solar array frame.

* * * * *